United States Patent [19]
Wang

[11] Patent Number: 5,856,223
[45] Date of Patent: Jan. 5, 1999

[54] METHOD FOR MANUFACTURING SELF-ALIGNED SPLIT-GATE FLASH MEMORY CELLS

[75] Inventor: Lin-Song Wang, Hsinchu, Taiwan

[73] Assignee: Winbond Electronics Corp., Hsinchu, Taiwan

[21] Appl. No.: 859,968

[22] Filed: May 21, 1997

[30] Foreign Application Priority Data

Feb. 25, 1997 [TW] Taiwan .................................. 86102305

[51] Int. Cl.⁶ ............................................... H01L 21/8247
[52] U.S. Cl. ........................................... 438/264; 438/266
[58] Field of Search .................... 438/264, 266, 438/267, 593, 594, 595

[56] References Cited

U.S. PATENT DOCUMENTS

| | | | |
|---|---|---|---|
| 5,364,806 | 11/1994 | Ma et al. ................................. | 438/266 |
| 5,482,879 | 1/1996 | Hong ....................................... | 438/264 |
| 5,482,881 | 1/1996 | Chen et al. .............................. | 438/264 |
| 5,607,871 | 3/1997 | Han ......................................... | 438/264 |

OTHER PUBLICATIONS

Naruke, et al., "A New Flash–Erase Eeprom Cell with a Sidewall Select–Gate on Its Source Side," *IEDM Tech. Dig.,* pp. 603–606 (1989).

Ma., et al., "A Novel High Density Contactless Flash Memory Array Using Split–Gate Source–Side–Injection Cell for 5V–Only Applications," *Symposium of VLSI Tech. Digest of Tech. Papers,* pp. 49–50 (1994).

*Primary Examiner*—Chandra Chaudhari
*Attorney, Agent, or Firm*—Fish & Richardson P.C.

[57] ABSTRACT

A method for manufacturing self-aligned split-gate flash memory cells wherein the split-gate structure is formed by a self-aligned approach, so that the length of a channel can be precisely controlled. Furthermore, sources and drains are formed separately by executing different implantations, so that the dopant parameters of the sources and drains can be changed, based on desired and possibly different characteristics.

18 Claims, 8 Drawing Sheets

METHOD FOR MANUFACTURING SELF-ALIGNED SPLIT-GATE FLASH MEMORY CELLS

BACKGROUND OF THE INVENTION

1. Field of the Invention

The invention relates to a memory cell process and, in particular, to a method for manufacturing split-gate flash memory cells.

2. Description of the Prior Art

A method for manufacturing electrically erasable programmable read-only memories (EEPROM) is disclosed by Naruke et al. in "A New Flash-Erase EEPROM Cell with a Sidewall Select-Gate on its Source Side" (Technical Digest of IEEE Electron Device Meeting in 1988). Referring to FIGS. 1A and 1B, a first poly-silicon layer and a second poly-silicon layer are formed as a floating gate 10 and a control gate 12, respectively. Next, a third poly-silicon layer is deposited; then, an etch-back technique is utilized to form a selection gate 14 wherein the height of the selection gate 14, defined by the height of the floating gate 10 and control gate 12, is about 0.4 µm. In addition, since etch-back is used in the above process, the selection gate 14 must be parallel to the control gate 12.

The disadvantages of the above-mentioned conventional process are that the selection gate and control gate which are parallel with each other take up too much space and the length of the selection gate is fixed, so that the characteristics of the memory can not be effectively adjusted. Solutions for overcoming these disadvantages are described in "A novel high density contactless flash memory array using split-gate source-side injection cell for 5V-only application" by Y. Ma at a symposium on VLSI Technology in 1994. As shown in FIG. 2, a high-density memory array and high access efficiency can be obtained by forming a parallel selection gate 22. However, due to limitations in the precision of the photolithography used to form the above-mentioned split-gate structure, the length of the selection gate 22 must be increased, thereby consuming a larger amount of space on the substrate and preventing a drain 24 and source 26 from being formed using separate and different implantations selected on the basis of desired and possibly different characteristics.

SUMMARY OF THE INVENTION

Accordingly, the object of the invention is to provide a method for manufacturing self-aligned split-gate flash memory cells wherein the split-gate structure is formed by a self-aligned approach, so that the length of a channel can be precisely controlled. Furthermore, sources and drains are formed separately by executing different implantations, so that the dopant parameters of the sources and drains can be changed, based on desired and possibly different characteristics.

BRIEF DESCRIPTION OF THE DRAWINGS

The objects, characteristics, and advantages of the present invention will be explained using a preferred embodiment with pertinent drawings as follows.

DETAILED DESCRIPTION OF THE INVENTION

Figure 1A:
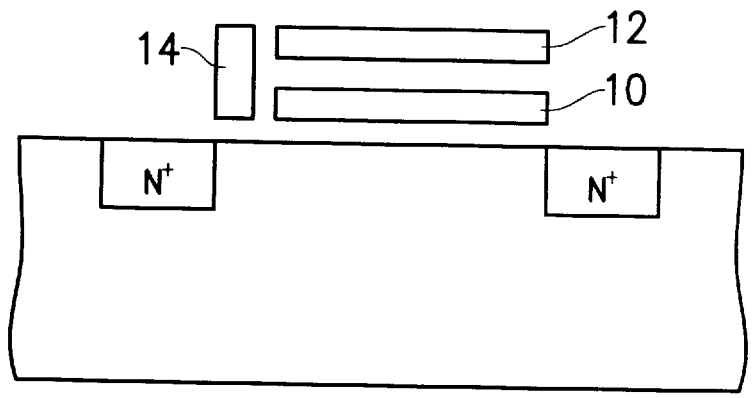
FIG. 1A is a cross-sectional view illustrating a flash EEPROM cell manufactured according to the prior art.
Figure 1B:
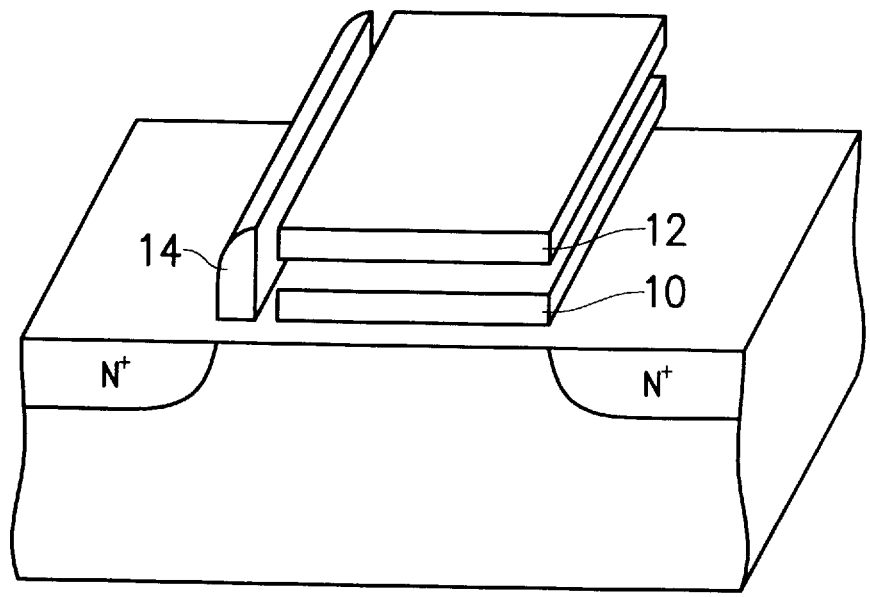
FIG. 1B is a perspective view illustrating a flash EEPROM cell manufactured according to the prior art.
Figure 2:
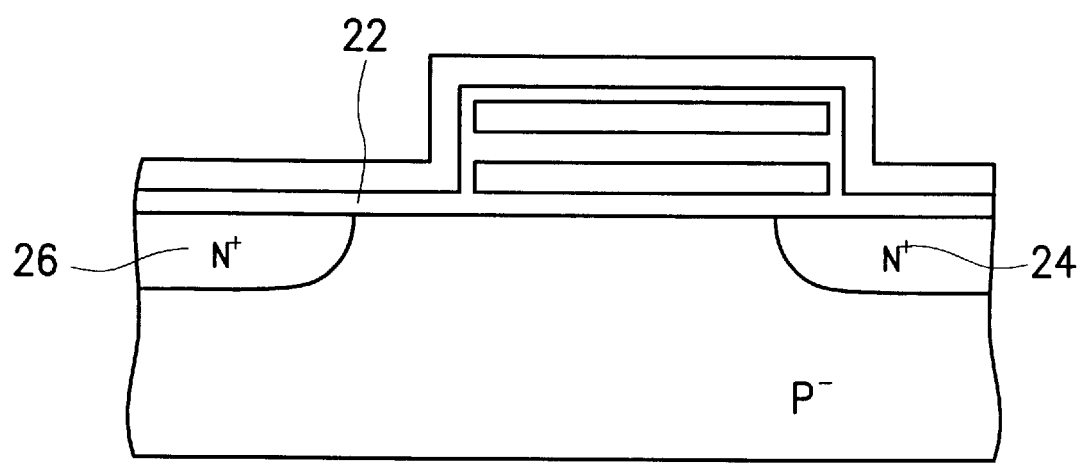
FIG. 2 is a cross-sectional view illustrating another flash EEPROM cell manufactured according to the prior art.
Figure 3A:
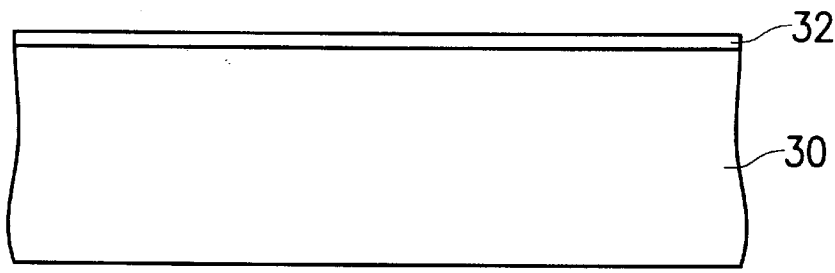
FIG. 3a–3m are cross-sectional views illustrating a method for manufacturing a self-aligned split-gate flash memory cell according to an embodiment of the invention.
Figure 3B:
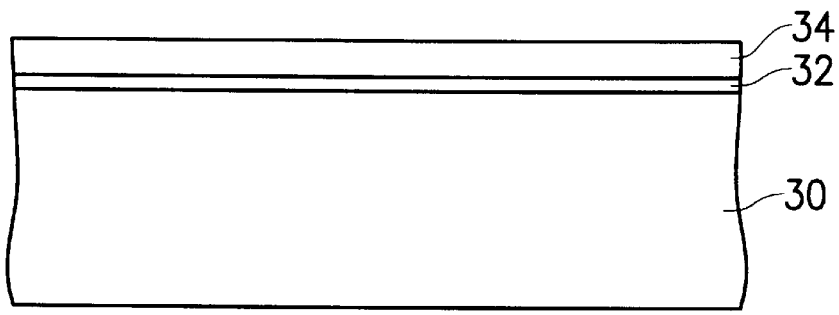
Figure 3C:
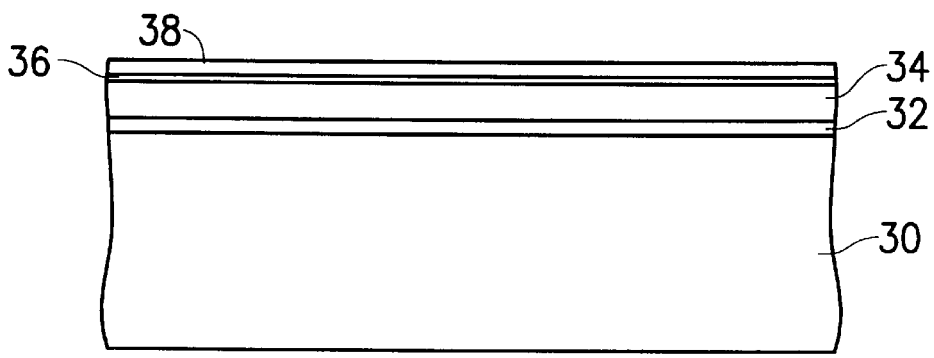
Figure 3D:
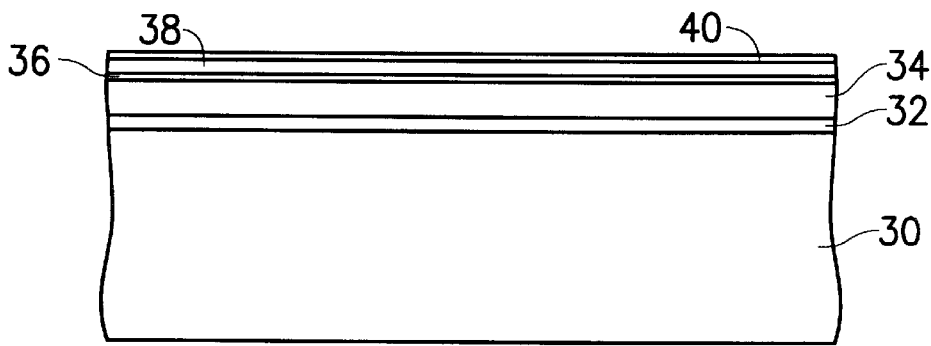
Figure 3E:
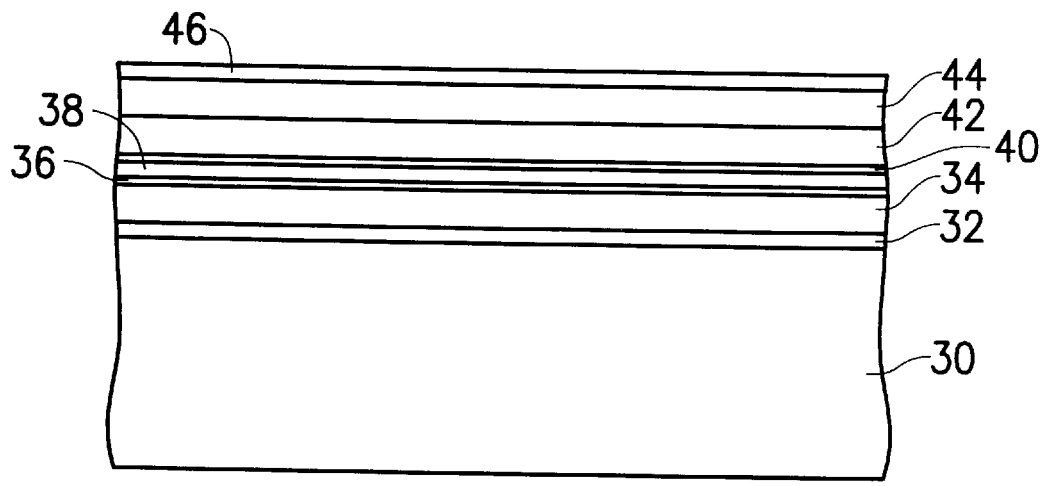
Figure 3F:
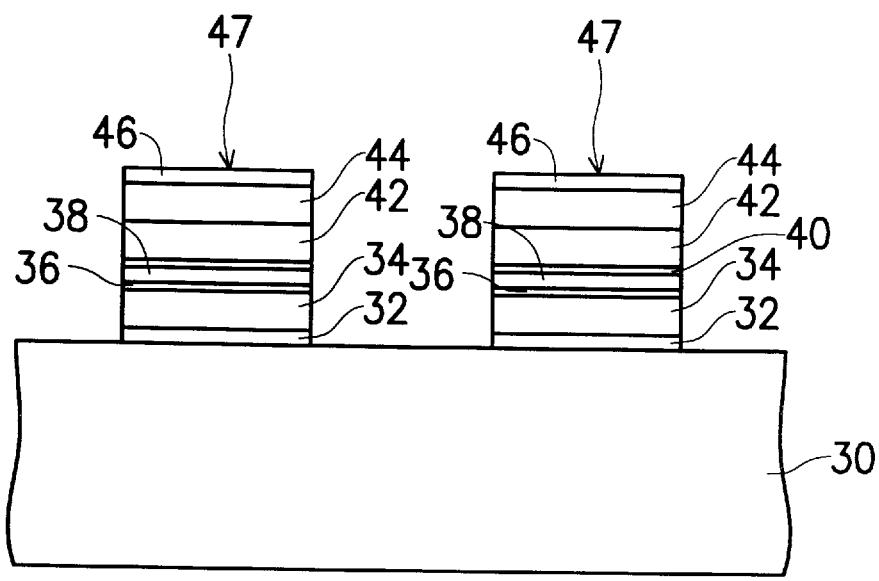
Figure 3G:
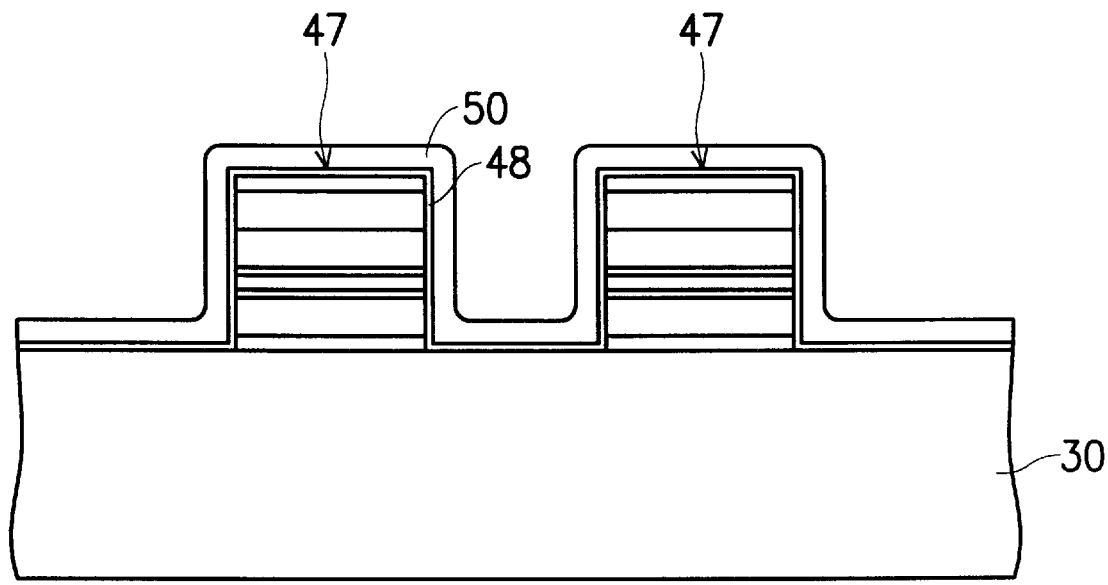
Figure 3H:
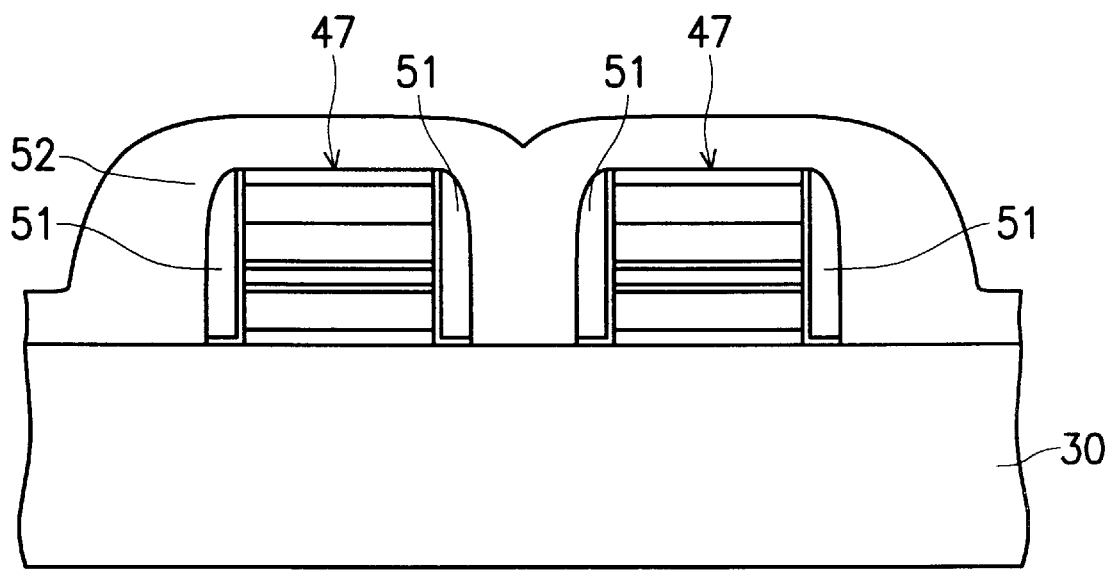
Figure 3I:
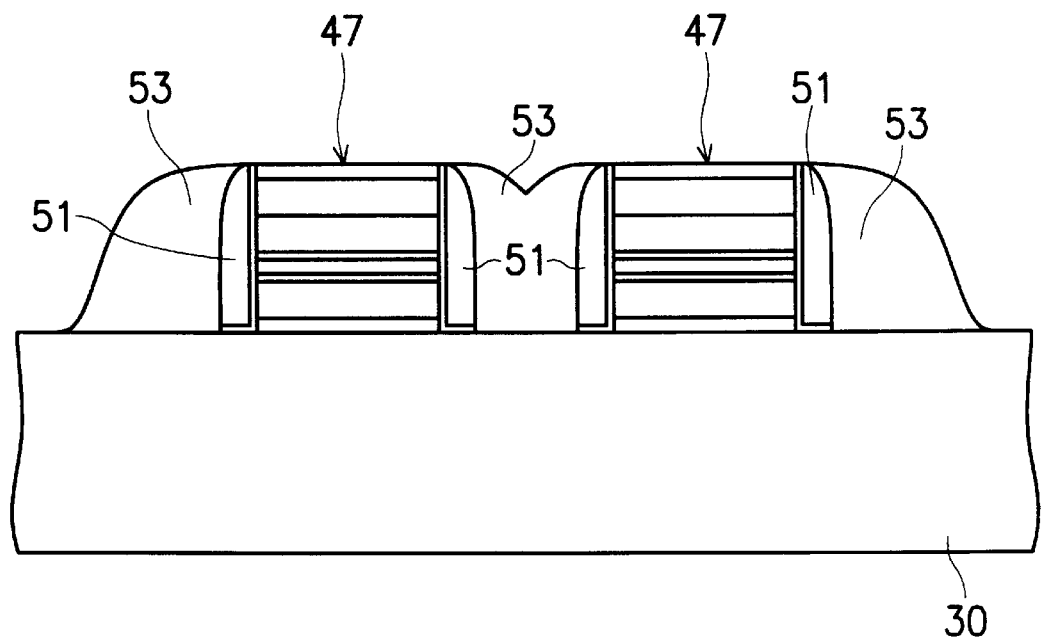
Figure 3J:
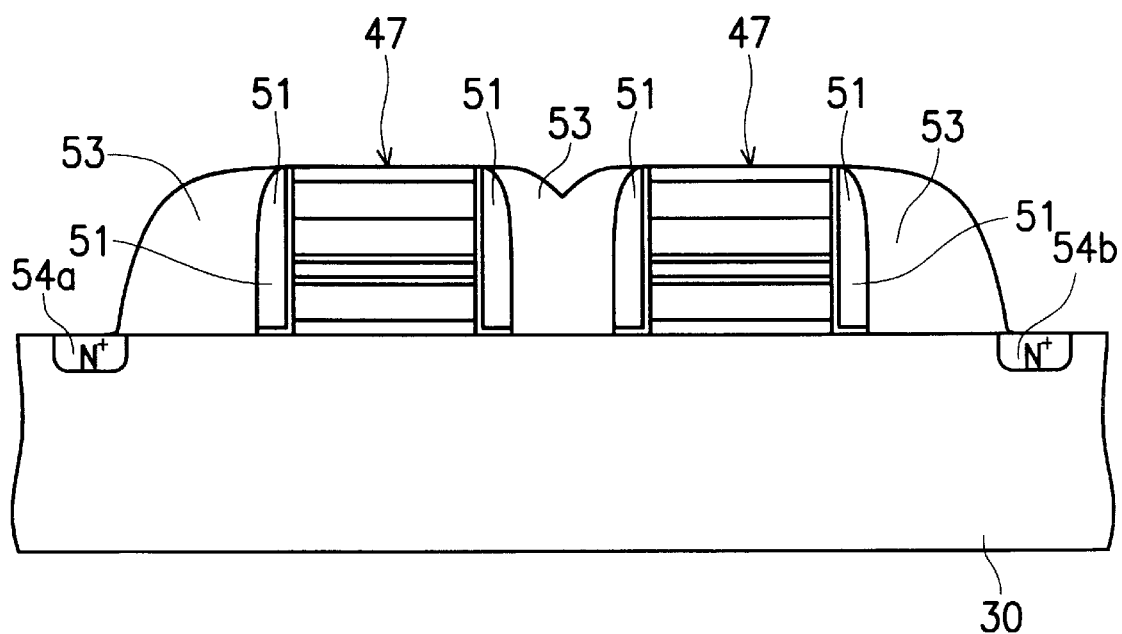
Figure 3K:
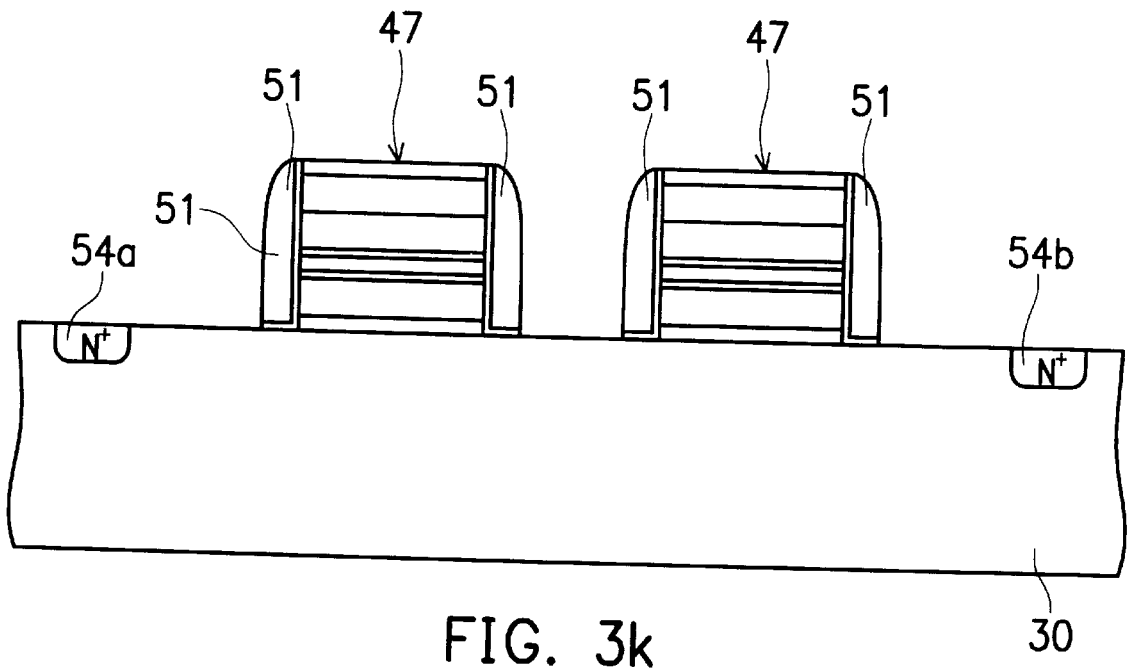
Figure 3L:
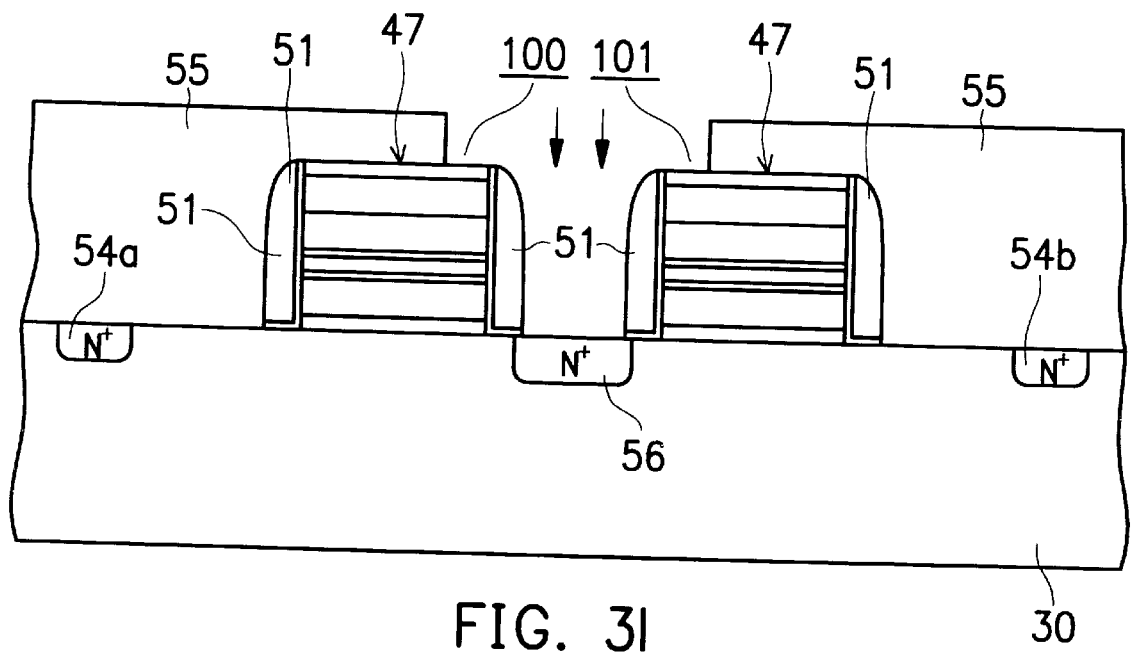
Figure 3M:
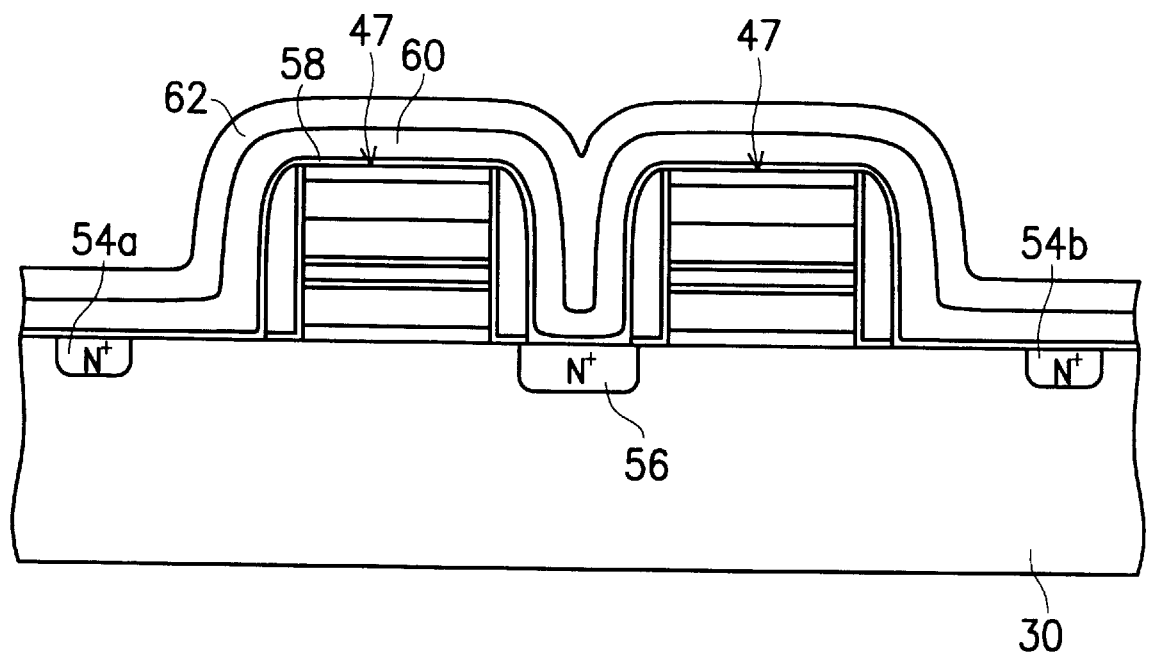

A method for manufacturing a self-aligned split-gate flash memory cell according to an embodiment of the invention is illustrated as follows. A tunneling oxide layer 32 having a thickness of 90 Å is formed on a substrate 30 (FIG. 3a). A first poly-silicon layer 34 having a thickness of 1,000 Å is deposited on tunneling oxide layer 32 (FIG. 3b). A first thermal oxide layer 36 having a thickness of 60 Å is deposited on first poly-silicon layer 34 and a first nitride layer 38 having a thickness of 150 Å is thereafter deposited on first thermal oxide layer 36 (FIG. 3c). A second thermal oxide layer 40 having a thickness in a range between 60 Å and 100 Å is deposited on first nitride layer 38 which together with second thermal oxide layer 40 and first oxide layer 36 forms an oxide-nitride-oxide (ONO) structure (FIG. 3d). A second poly-silicon layer 42 having a thickness of 1,500 Å is deposited on second thermal oxide layer 40; a TEOS layer 44 having a thickness of 1000 Å A on second poly-silicon layer 42; followed by an additional nitride layer 46 having a thickness of 400 Å on TEOS layer 44 (FIG. 3e). Two gates 47 each of which includes a control gate and a floating gate are formed by a self-aligned etching process (FIG. 3f). A third thermal oxide layer 48 having a thickness of 60 Å is deposited over the two gates and the exposed surfaces of substrate 30, and a second nitride layer 50 having a thickness of 200 Å is then deposited over third thermal oxide layer 48 (FIG. 3g). A back-etch is executed in order to form nitride spacers 51 from second nitride layer 50. An oxide layer 52—for example, a TEOS layer—having a thickness in a range between 5,000 Å and 6,000 Å is then deposited over spacers 51, the two gates and exposed surfaces of substrate 30 (FIG. 3h). A back-etch is executed in order to form oxide spacers 53 from oxide layer 52 to cover spacers 51 and portions of substrate 30 (FIG. 3i). Source regions 54a and 54b are formed by utilizing oxide spacers 53 as a mask and implanting a dopant, such as arsenic atoms having an energy level of 50 KeV and a concentration of $7E15/cm^3$ (FIG. 3j). Fluorhydric acid (HF) is used to remove oxide spacers 53 (FIG. 3k). By means of photolithography, a photoresist 55 is formed over substrate 30 and the gates except between transistors 100 and 101; a drain 56 is then formed by implantation with a dopant, such as arsenic atoms having an energy level of 50 KeV and a concentration of $7E15/cm^3$ (FIG. 3l). Photoresist 55 is removed and a fourth thermal oxide, a third poly-silicon layer 60, and a tungsten silicon (WSi) layer 62, having a thickness of 220 Å, 1,500 Å, and a 1,200 Å, respectively are deposited over the gates and substrate 30 (FIG. 3m). A word line (not shown) is then defined by etching to third poly-silicon layer 60.

Other embodiments are within the claims. For example, floating gate regions may be defined by etching and then by implanting the floating gate regions with a dopant, such as arsenic atoms having a concentration in a range between about $5E15/cm3$ and about $7E15/cm^3$ and an energy level in a range between about 30 KeV and about 50 KeV after step 3, i.e., after depositing first thermal oxide layer 36 and first nitride layer 38.

Although the invention has been disclosed in terms of a preferred embodiment, the disclosure is not intended to limit the invention. Those knowledgeable in the art can make modifications within the scope and spirit of the invention which is determined by the claims below.

What is claimed is:

1. A method for manufacturing self-aligned split-gate flash memory cells comprising:

provalidating a substrate and forming a tunneling oxide layer on said substrate;

depositing a first poly-silicon layer on said tunneling oxide layer;

depositing a first thermal oxide layer on the first poly-silicon layer and then depositing a first nitride layer on said first thermal oxide layer;

depositing a second thermal oxide layer over said first nitride layer;

depositing a second poly-silicon layer over the second thermal oxide layer and depositing a second dielectric structure over said second poly-silicon layer;

forming a plurality of gates using a self-aligned etching process;

depositing a third thermal oxide layer over the plurality of gates and the substrate, and depositing a second nitride layer over said third thermal oxide layer;

forming a plurality of nitride spacers by executing a back etch to said second nitride layer, and then depositing an oxide layer over the nitride spacers, the plurality of gates and the substrate;

forming a plurality of oxide spacers around and between the plurality of gates by executing a back etch to said oxide layer;

forming a plurality of sources by ion implantation by using said oxide spacers as a mask, and then removing said oxide spacers;

forming a photoresist over said substrate except for regions between the plurality of gates by photolithography and then executing implantation to form a plurality of drains;

removing said photoresist;

depositing a fourth thermal oxide layer over the plurality of gates and the substrate, depositing a third poly-silicon layer over said fourth thermal oxide layer, and depositing a metal silicide layer over said third poly-silicon layer; and etching said third poly-silicon layer.

2. The method for manufacturing self-aligned split-gate flash memory cells as claimed in claim 1 wherein said second dielectric structure is a TEOS layer.

3. The method for manufacturing self-aligned split-gate flash memory cells as claimed in claim 2 wherein the thickness of said TEOS layer is about 1,000 Å.

4. The method for manufacturing self-aligned split-gate flash memory cells as claimed in claim 1 wherein said metal silicide layer is a tungsten silicon (WSi) layer.

5. The method for manufacturing self-aligned split-gate flash memory cells as claimed in claim 4 wherein the thickness of said tungsten silicon layer is about 1,200 Å.

6. The method for manufacturing self-aligned split-gate flash memory cells as claimed in claim 1 wherein the thickness of said tunneling oxide layer is about 90 Å.

7. The method for manufacturing self-aligned split-gates flash memory cells as claimed in claim 1 wherein the thickness of said first poly-silicon layer is about 1,000 Å.

8. The method for manufacturing self-aligned split-gate flash memory cells as claimed in claim 1 wherein the thickness of said first thermal oxide layer is about 60 Å.

9. The method for manufacturing self-aligned split-gate flash memory cells as claimed in claim 1 wherein the thickness of said first nitride layer is about 150 Å.

10. The method for manufacturing self-aligned split-gate flash memory cells as claimed in claim 1 wherein the thickness of said second thermal oxide layer is in a range between about 60 Å and about 100 Å.

11. The method for manufacturing self-aligned split-gate flash memory cells as claimed in claim 1 wherein the thickness of said second poly-silicon layer is about 1,500 Å.

12. The method for manufacturing self-aligned split-gate flash memory cells as claimed in claim 1 wherein the thickness of said second dielectric structure is about 1,000 Å.

13. The method for manufacturing self-aligned split-gate flash memory cells as claimed in claim 1 wherein a dopant used in said implantation of forming said sources may be arsenic atoms having an energy level of about 50 KeV and a concentration of about $7E15/cm^3$.

14. The method for manufacturing self-aligned split-gate flash memory cells as claimed in claim 1 wherein said oxide spacers are removed by using fluorhydric acid (HF).

15. The method for manufacturing self-aligned split-gate flash memory cells as claimed in claim 1 wherein a dopant used in said implantation of forming said drains may be arsenic atoms having an energy level of about 50 KeV and a concentration of about $7E15/cm^3$.

16. The method for manufacturing self-aligned split-gate flash memory cells as claimed in claim 1 wherein the thickness of said third thermal oxide layer is about 220 Å.

17. The method for manufacturing self-aligned split-gate flash memory cells as claimed in claim 1 wherein the thickness of said third poly-silicon layer is about 1,500 Å.

18. The method for manufacturing self-aligned split-gate flash memory cells as claimed in claim 1 wherein the thickness of said second nitride layer is about 200 Å.

* * * * *